United States Patent [19]

Kurokawa

[11] Patent Number: 4,766,007
[45] Date of Patent: Aug. 23, 1988

[54] PROCESS FOR FORMING DEPOSITED FILM

[75] Inventor: Takashi Kurokawa, Yokohama, Japan

[73] Assignee: Canon Kabushiki Kaisha, Tokyo, Japan

[21] Appl. No.: 104,526

[22] Filed: Oct. 1, 1987

Related U.S. Application Data

[63] Continuation of Ser. No. 906,613, Sep. 10, 1986, abandoned, which is a continuation of Ser. No. 631,647, Jul. 17, 1984, abandoned.

[30] Foreign Application Priority Data

Jul. 21, 1983 [JP] Japan ................................ 58-131936

[51] Int. Cl.⁴ .......................................... B05D 3/06
[52] U.S. Cl. .................................................. 427/39
[58] Field of Search .......................................... 427/39

[56] References Cited

U.S. PATENT DOCUMENTS 4,507,375  3/1985  Hirai ........................................ 427/39

FOREIGN PATENT DOCUMENTS 2753190  8/1978  Fed. Rep. of Germany .
2069008  8/1981  United Kingdom .

Primary Examiner—Bernard D. Pianalto
Attorney, Agent, or Firm—Fitzpatrick, Cella, Harper & Scinto

[57] ABSTRACT

A process for forming deposited film of an element or a compound on a substrate provided in a deposition chamber while applying an energy selected from the group consisting of thermal energy, electrodischarging energy and optical energy, characterized by cooling the electrode or both electrode and inner wall of a deposition chamber, which are opposed to the substrate.

9 Claims, 2 Drawing Sheets

PROCESS FOR FORMING DEPOSITED FILM

This application is a continuation of application Ser. No. 906,613 filed Sept. 10, 1986, which is a continuation of application Ser. No. 631,647, filed July 17, 1984, each now abandoned.

BACKGROUND OF THE INVENTION

1. Field of the Invention

The present invention relates to a process for forming electrophotoconductive film, a semiconductor film, an inorganic dielectric film and an organic resin film while applying energy of a type selected from the group consisting of thermal energy, electric discharging energy and optical energy, and an apparatus for forming the same.

2. Description of the Prior Art

It has been known to form a film of a single element or a compound from gases or produced gases by activating and decomposing or reacting a source gas and applying energy selected from the group consisting of thermal, electrodischarging or optical energy after introducing the gas into a deposition chamber.

However, when the temperature of the electrode which is opposed to a substrate becomes higher by applying thermal, electrodischarging or optical energy, the quality of the deposited film is deteriorated. For example, in the case of a stainless steel electrode, the electrodes release such gases as $N_2O$, $O_2$, $CO_2$, $H_2$, $CO$, $N_2$ and the like to result in lowering the quality of the deposited film. Therefore, a bake-out treatment of the electrode for a long period of time has been required before practical application in order to remove releasable gases from the electrode.

SUMMARY OF THE INVENTION

An object of the present invention is to provide a forming process for a deposited film capable of preventing deterioration of the deposited film without performing a bake-out treatment of the electrode for a long period of time at a higher temperature but by performing a simple treatment before practical application.

Another object of the present invention is to provide an apparatus for forming a deposited film capable of suppressing deterioration caused by the gases released from the electrode, without performing a bake-out treatment of the electrode for a long period of time at a higher temperature but instead by means of a simple treatment before practical application.

According to one aspect of the present invention there is provided a process for forming a deposited film of an element or a compound on a substrate provided in a deposition chamber by applying energy selected from the group consisting of thermal energy, electrodischarging energy and optical energy, characterized by cooling the electrode or both electrode and inner wall of a deposition chamber, which are opposed to the substrate.

According to another aspect of the present invention there is provided an apparatus for forming deposited film of an element or a compound on a substrate provided in a deposition chamber applying energy selected from the group consisting of thermal energy, electrodischarging energy and optical energy, characterized by providing a cooling means at a side of the electrode or both at an electrode and at an exterior surface of the deposition chamber wall, which are opposed to the substrate.

DESCRIPTION OF THE PREFERRED EMBODIMENTS

According to the process of the present invention, the deposition chamber is cooled by flowing a coolant, such as water, liquid nitrogen, Freon gas and the like, into a cooling section in the chamber. It is preferable to maintain the temperature of an electrode, or both an electrode and an inner surface of the deposition chamber, which are opposed to a substrate, at 150° C. or lower. The cooling of the electrode or both electrode and inner surface of the chamber may not be fully achieved if the temperature exceeds 150° C. Since the cooling means according to the present invention satisfies the principal object of the invention, provided that the electrode or both electrode and inner wall of the deposition chamber may be effectively cooled, a various type of the cooling means, such as cooling section attached to the electrode or inner wall of the deposition chamber, cooling pipe surrounding the electrode, etc. may be used.

Figure 1:
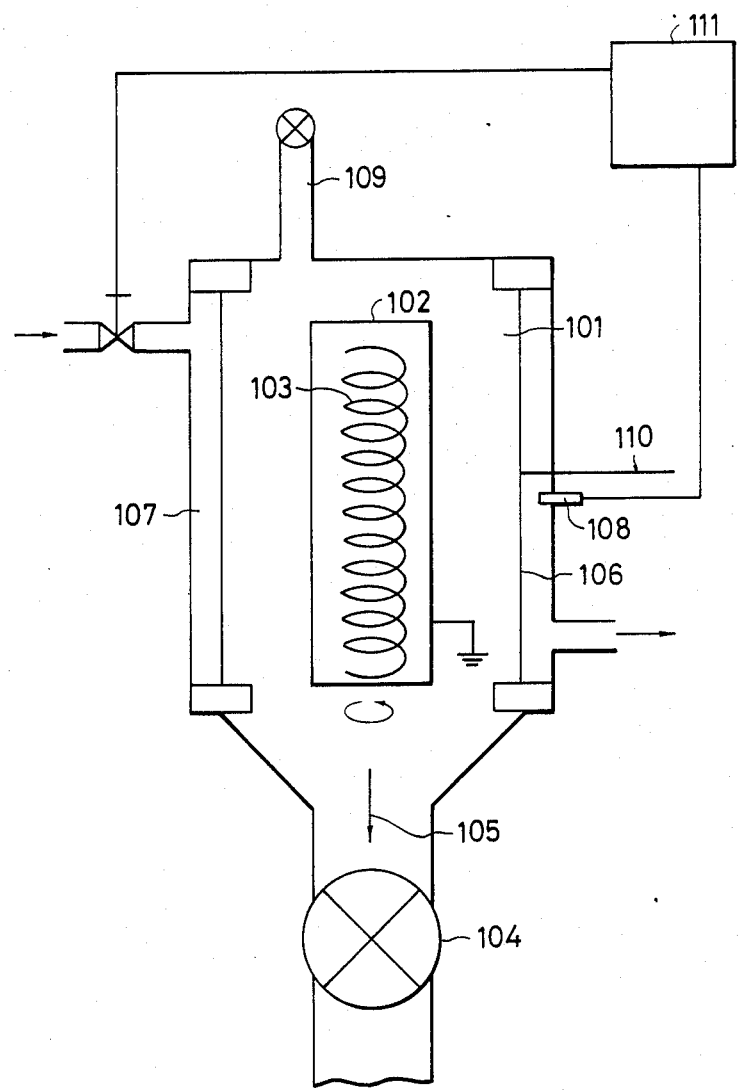
FIG. 1 shows a schematical cross-sectional view of the film forming apparatus according to the present invention.

The embodiment of the apparatus according to the present invention is further explained referring to the accompanied drawings. FIG. 1 is a Plasma CVD apparatus for forming hydrogenated amorphous silicon (hereinafter referred to as a-Si:H). 101 is a deposition chamber which can be evacuated. In the deposition chamber 101, a cylindrical substrate 102 on which to deposit a film, and a substrate heater 103 for heating the substrate 102 are provided and an exhaust outlet 105 is provided at a lower part of the deposition chamber 101, so as to evacuate the deposition chamber 101 to required pressure by an evacuating means (not shown) after opening a valve 104.

An electrode 106 is placed and utilized as an inner wall of the deposition chamber 101 to generate a glow discharge between the electrode and substrate 102 opposed to the electrode 106 which is grounded. The substrate 102 turns around so as to form thereon a film uniform in its quality.

The electrode 106 is connected to a radio frequency power source through a matching circuit (not shown). There is provided an electrode cooling chamber 107 outside of the deposition chamber 101. The temperature of the cooling section is controlled by a thermocontroller 111 to vary the amount of coolant. The temperature is measured by an infrared thermomonitor 108 which is not attached on the outer wall of the deposition chamber.

A starting gas inlet 109 is provided at an upper part of the deposition chamber 101 to introduce a starting gas therethrough. The substrate 102 is previously heated to and maintained at a predetermined appropiate temperature by substrate heater 103. The deposition chamber 101 is cooled to 150° C. or below through the electrode cooling section 107 to prevent raising the electrode temperature with heat from the substrate.

The process of the present invention may be used for forming a film of an amorphous silicon containing C, N, O, an element of Group III of the periodic table, such as B and the like, or an element of Group V of the periodic table, such as P and the like, as well as a film of a-Si:H, to produce a film having an excellent dielectric property.

The present invention is illustrated in more detail by way of the following example.

EXAMPLE

Figure 2:
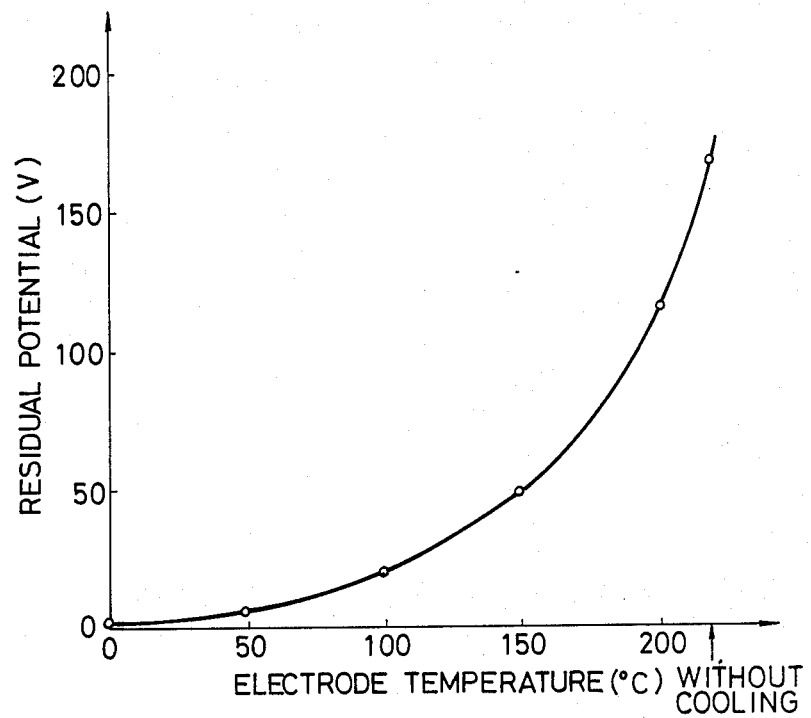
FIG. 2 is a graph showing a relation between an electrode temperature and a residual potential.

Using the apparatus for forming deposited film shown in FIG. 1, a-Si:H film was formed with a mixture of 5–40 vol % of $SiH_4$ gas and 95–60 vol % of $H_2$ gas, as a starting gas. The substrate was previously heated to 200°–400° C., and starting gas was introduced through the inlet 109 at a pressure of 0.1–2 torr., and a flow rate of 0.1–2 l/hr. The a-Si:H film was formed by exciting a glow discharge while the substrate was cooled to 200° C., 150° C., 100° C., 50° C. and 0° C., respectively with liquid nitrogen. The temperature and the residual potential were measured. The results that were obtained are in FIG. 2. At the same time the residual potential without cooling the electrode was measured as a comparison. The result of that measurement is also shown in FIG. 2. From FIG. 2, it is clear that the residual potential is steeply increased when the electrode temperature exceeds 150° C. Accordingly, the electrode temperature is preferred to be kept at 150° C. or lower according to the present invention. The a-Si:H film formed at 150° C. or lower was excellent in dark resistance and photoelectrical property and had a uniform quality.

What is claimed is:

1. A process for forming a deposited film on a substrate, comprising the steps of:

providing the substrate and silicon and hydrogen atoms in a deposition chamber;

forming a deposited film on the substrate which film comprises amorphous silicon containing hydrogen atoms by applying electro-discharging energy to a stainless steel electrode opposed to the substrate; and cooling said electrode to maintain such electrode at a temperature of 150° C. or lower while performing said forming step.

2. A process for forming a deposited film according to claim 1 wherein the inner wall of the deposition chamber which is opposed to the substrate is also cooled to 150° C. or lower in said cooling step.

3. A process for forming a deposited film according to claim 1 wherein said cooling step takes place with a liquid coolant flowing to a cooling chamber.

4. A process for forming a deposited film according to claim 3 wherein said cooling step takes place with the liquid coolant flowing to a cooling coil.

5. A process for forming a deposited film according to claim 1 wherein the substate is cylindrical.

6. The process of any of claims 1–5, wherein an inner wall of said deposition chamber provides said stainless steel electrode.

7. The process of claim 1, wherein said silicon and hydrogen atoms are in the form of $SiH_4$ molecules.

8. The process of claim 7, wherein said deposition chamber further contains $H_2$ molecules.

9. The process of either of claims 7 or 8, wherein said deposition chamber further contains a gaseous material containing elements selected from the group consisting of C, N, O, Group III elements and Group V elements.

* * * * *

UNITED STATES PATENT AND TRADEMARK OFFICE
CERTIFICATE OF CORRECTION

PATENT NO. : 4,766,007

DATED : August 23, 1988

INVENTOR(S) : Takashi Kurokawa

It is certified that error appears in the above-identified patent and that said Letters Patent is hereby corrected as shown below:

COLUMN 2

Line 62, change "appropiate" to --appropriate--.

COLUMN 4

Line 22, change "substate" to --substrate--.

Signed and Sealed this

Twenty-seventh Day of June, 1989

Attest:

DONALD J. QUIGG

Attesting Officer      Commissioner of Patents and Trademarks